«(12) United States Patent
Takahashi

(10) Patent No.: US 8,918,301 B2
(45) Date of Patent: Dec. 23, 2014

(54) MOTOR CONDITION INSPECTION METHOD AND MOTOR CHARACTERISTIC INSPECTING DEVICE

(75) Inventor: Akihiko Takahashi, Nagano (JP)

(73) Assignee: Sanyo Denki Co., Ltd., Tokyo (JP)

( * ) Notice: Subject to any disclaimer, the term of this patent is extended or adjusted under 35 U.S.C. 154(b) by 550 days.

(21) Appl. No.: 13/358,060

(22) Filed: Jan. 25, 2012

(65) Prior Publication Data

US 2012/0197564 A1  Aug. 2, 2012

(30) Foreign Application Priority Data

Jan. 27, 2011 (JP) ................. 2011-015281

(51) Int. Cl.
G06F 19/00 (2011.01)
G01R 19/12 (2006.01)
G01R 31/34 (2006.01)

(52) U.S. Cl.
CPC .................. G01R 31/343 (2013.01)
USPC .......................................... 702/64

(58) Field of Classification Search
CPC .................................. G01R 31/343
USPC .......................................... 702/64
See application file for complete search history.

(56) References Cited

U.S. PATENT DOCUMENTS

| 6,998,814 | B2* | 2/2006 | Wang et al. ............ 318/729 |
| 8,836,257 | B2* | 9/2014 | Savitz .................. 318/400.32 |
| 2006/0208723 | A1* | 9/2006 | Iguchi ................... 324/200 |
| 2011/0029179 | A1* | 2/2011 | Miyazaki et al. ......... 701/22 |
| 2011/0029271 | A1 | 2/2011 | Takahashi | |

FOREIGN PATENT DOCUMENTS

| JP | 61-124256 | 6/1986 |
| JP | 2002-267727 | 9/2002 |
| JP | 2011-033356 | 2/2011 |

* cited by examiner

Primary Examiner — Jonathan C Teixeira Moffat
Assistant Examiner — Regis Betsch
(74) Attorney, Agent, or Firm — Rankin, Hill & Clark LLP

(57) ABSTRACT

A motor characteristic inspecting device is capable of inspecting the condition of a motor installed in an apparatus without removing the motor from the apparatus. The motor characteristic inspecting device includes: a vector variation computing section configured to compute a voltage vector variation amount when a mover of a three-phase motor is moved by an external force; a speed variation detecting section configured to detect a speed variation amount; a constant computing section configured to compute a counter electromotive force constant; and a result display section. Armature windings of the motor installed in the apparatus and the motor characteristic inspecting device are electrically connected with power supply lines disconnected from the motor. An external force is applied to the mover of the motor. The condition of the motor is determined based on the computed result displayed on the result display section of the motor characteristic inspecting device.

20 Claims, 7 Drawing Sheets

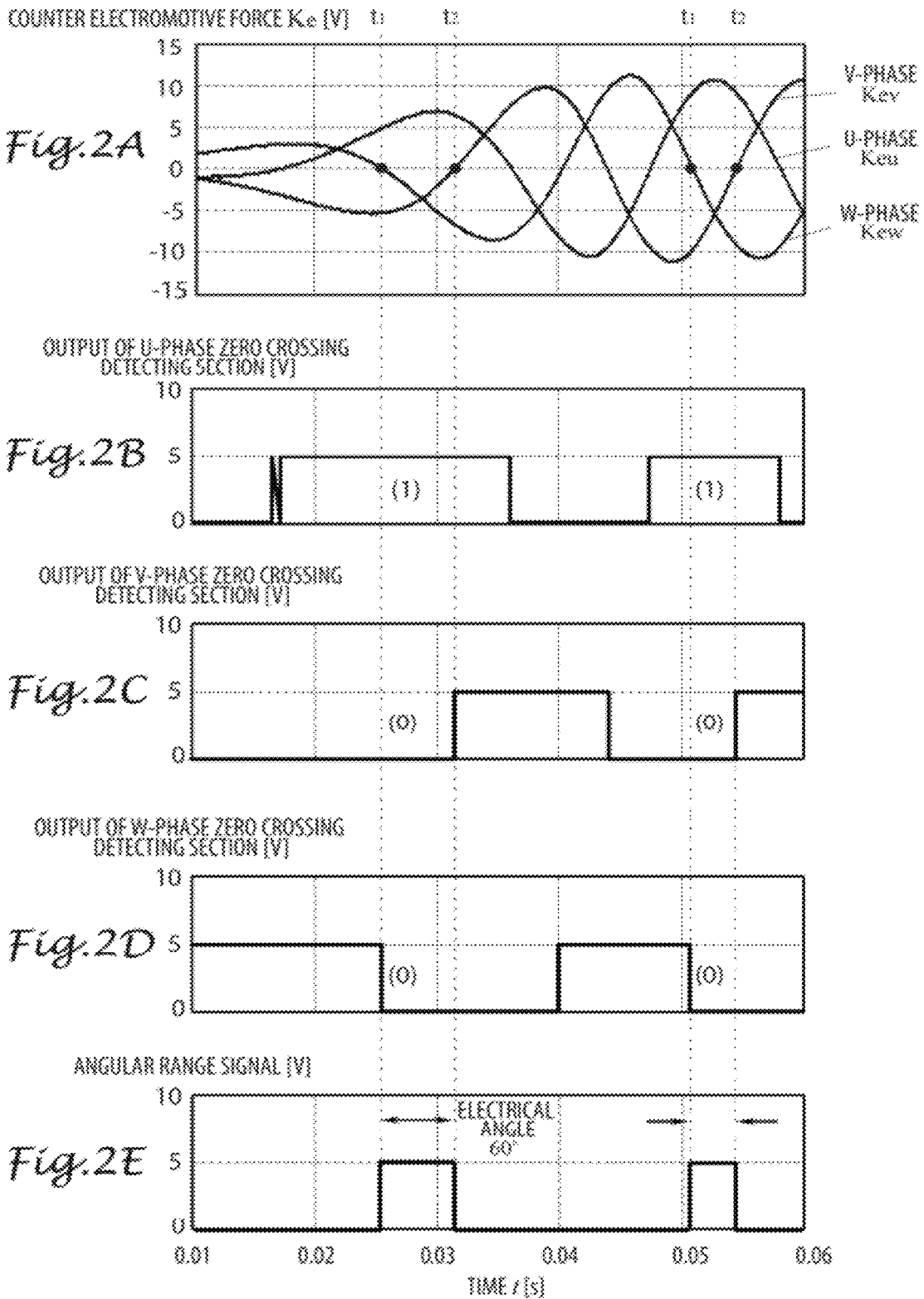

MOTOR CONDITION INSPECTION METHOD AND MOTOR CHARACTERISTIC INSPECTING DEVICE

FIELD OF THE INVENTION

The present invention relates to a motor condition inspection method and a motor characteristic inspecting device for a motor that generates counter electromotive forces (counter electromotive voltages) when a mover of the motor is moved by an external force.

BACKGROUND ART

According to conventional motor condition inspection methods and motor characteristic inspecting devices, power is supplied to a motor to drive the motor at a constant rotational speed, and the output of the motor is measured to inspect the characteristics of the motor such as a torque. It is necessary to use a voltmeter, a tachometer, a speed sensor, or the like for inspection in order to perform necessary measurements. Conventionally, it is necessary to remove the motor from the apparatus where the motor is installed and then mount the motor on a dedicated inspecting device in order to inspect the characteristics of the motor, instead of directly inspecting the motor which is installed in the apparatus. Accordingly, it is necessary to remove the motor from the apparatus for each regular check or inspection, which consumes substantial labor and time for the inspection. In addition, the installation condition of the motor cannot be checked by inspecting the motor which has been removed from the apparatus.

For a linear motor, in particular, the installation condition of a mover and a stator (whether a so-called air gap is proper or not) affects the output of the motor. Conventionally, a gap gauge is inserted into a gap formed between the mover and the stator to mechanically measure the size of the gap in order to inspect the installation condition. In this case, however, inspection is performed with the motor removed from the apparatus, and thus a mechanical error may occasionally occur when the motor is reinstalled in the apparatus after the inspection. In addition, it is difficult to inspect whether or not the gap formed between the mover and the stator is totally uniform.

Under these circumstances, the inventors invented a motor condition inspection method and a motor characteristic inspecting device allowing inspection of the characteristics of a motor by computing a counter electromotive force constant based on the frequency value and the amplitude value of the waveform of a counter electromotive force generated when the motor is moved by an external force (Refer to Japanese Patent Application No. 2009-177091).

In the technique disclosed by Japanese Patent Application No. 2009-177091, the frequency is detected based on half the cycle of the counter electromotive voltage (corresponding to an electrical angle of 180°). If abrupt variations (abrupt variations in speed for a linear motor, and abrupt variations in number of revolutions for a rotary motor) are caused in half the cycle of the counter electromotive voltage during acceleration or deceleration, the duty ratio of the frequency before and after a peak value of the voltage may significantly vary, which tends to cause an error in the inspection results. For example, as shown in FIG. 7, the duty ratio ($f_{1A}$:$f_{1B}$) of the frequency is significantly varied in a time segment (A), which increases the possibility of an error compared to a time segment (B) in which the duty ratio ($f_{2A}$:$f_{2B}$) of the frequency is not significantly varied.

SUMMARY OF THE INVENTION

An object of the present invention is to provide a motor condition inspection method and a motor characteristic inspecting device that allow inspection of a motor installed in an apparatus without removing the motor from the apparatus and that reduce the possibility of an error in the inspection results.

Another object of the present invention is to provide a motor condition inspection method and a motor characteristic inspecting device that make it possible to conveniently inspect whether or not a motor is properly installed.

The present invention is directed to a motor condition inspection method and a motor characteristic inspecting device allowing inspection of the condition of a three-phase motor installed in an apparatus without removing the three-phase motor from the apparatus.

It is publicly known that a motor has a power generating function. Thus, when a mover of a three-phase motor is moved by an external force, counter electromotive forces (counter electromotive voltages) for three phases are generated across input terminals of the three-phase motor. In the present invention, a counter electromotive force constant $K_{e\phi}$, which is one of constants indicating the characteristics of the motor, is computed to determine whether or not the characteristics of the motor are proper.

The present invention provides a motor characteristic inspecting device including: an angular range detecting section configured to detect a predetermined angular range including a peak value of a counter electromotive force for one phase among counter electromotive forces for three phases generated in armature windings of the three-phase motor when a mover of the three-phase motor is moved with no power supply, the predetermined angular range being less than 180° in terms of electrical angle; a three-phase-to-two-phase converting section configured to convert the counter electromotive forces for three phases into a two-phase AC voltage equivalent to the counter electromotive forces for three phases through αβ conversion such that α axis indicates the counter electromotive force for one phase; a vector variation computing section configured to compute a voltage vector variation amount which is an amount of variation in voltage vector in the predetermined angular range, based on an amount of variation in α component and an amount of variation in β component in the predetermined angular range; a speed variation detecting section configured to detect a speed variation amount which is an amount of variation in speed of the mover in the predetermined angular range; a constant computing section configured to compute a counter electromotive force constant based on the speed variation amount and the voltage vector variation amount; and a result display section configured to display a predetermined indication for a computed result or an expected computed result of the counter electromotive force constant. Thus, when counter electromotive forces for three phases are input, the motor characteristic inspecting device can calculate variations in speed that occur when the mover is moved by an external force over a predetermined angular range that is smaller than 180° in terms of electrical angle and the amount of increase in counter electromotive forces due to the variations in speed, as the voltage vector variation amount. The counter electromotive force constant calculated based on the voltage vector variation amount calculated as described above is subjected to a smaller error, even during acceleration or deceleration, than that for a counter electromotive force constant calculated based on the amount of variation in counter electromotive voltages. Thus, it is possible to accurately determine whether or not the characteristics of the motor are proper compared to the related art. The term "voltage vector" used herein refers to a vector having α component and β component obtained by performing a three-phase-to-two-phase conversion on the components of the counter electromotive forces for three phases.

The angular range detecting section may determine the predetermined angular range by various methods. For example, the angular range detecting section may be configured to detect zero crossing points at which the counter electromotive forces for three phases become zero, and to determine the predetermined angular range based on the zero crossing points. In this case, an angular range of 60° may be determined as the predetermined angular range. Alternatively, the angular range detecting section may be configured to detect zero crossing points at which the counter electromotive forces for three phases and the two-phase AC voltage become zero, and to determine the predetermined angular range based on the zero crossing points. In this case, an angular range of 30° may be determined as the predetermined angular range. A smaller angular range that is smaller than 180° in terms of electrical angle results in a smaller amount of variation in voltage vector, and hence in a smaller error in the counter electromotive force constant. Therefore, the error in the counter electromotive force constant can be reduced by determining the counter electromotive force constant for an angular range of 30° than by determining the counter electromotive force constant for an angular range of 60°.

For example, the voltage vector variation amount $\Delta V_{vec}$ in the predetermined angular range can be computed by the following formula:

$$\Delta V_{vec} = \sqrt{(V_{\alpha 2} - V_{\alpha 1})^2 + (V_{\beta 2} - V_{\beta 1})^2} \quad \text{[Expression 1]}$$

where $V_{\alpha 1}$ and $V_{\beta 1}$ stand for α component and β component of a first voltage vector at a start point of the predetermined angular range, respectively, and $V_{\alpha 2}$ and $V_{\beta 2}$ stand for α component and β component of a second voltage vector at an end point of the predetermined angular range, respectively.

Thus, the voltage vector variation amount $\Delta V_{vec}$ may be considered as the magnitude of the difference between the first voltage vector and the second voltage vector.

According to the present invention, the error in the computed counter electromotive force constant can be reduced even if abrupt variations in speed occur. In order to further reduce the error, however, the result display section may be configured to display the computed result or the indication for the computed result if a difference between two voltage vector variation amounts for two divided angular ranges obtained by bisecting the predetermined angular range is equal to or smaller than a predetermined allowable value. If the difference between the two voltage vector variation amounts is larger than the predetermined allowable value, abrupt variations in speed are occurring, which tends to cause a significant error in the computed counter electromotive force constant. Thus, the reliability of the inspection results obtained by the present invention can be improved by causing the result display section to display the computed result or the indication for the computed result only when the difference is equal to or smaller than the allowable value.

The motor to be inspected by the present invention may be any three-phase motor, whether a three-phase rotary motor or a linear motor, that allows detection of counter electromotive forces. If the three-phase motor is a three-phase rotary motor in which the mover is rotatable, the speed variation detecting section may be configured to detect the number of revolutions per unit time made by the mover as the speed, and to identify an amount of variation in the number of revolutions as the speed variation amount.

If the three-phase motor is a linear motor including a stator fixed to a stationary portion of the apparatus and the mover provided in a movable portion of the apparatus, the motor characteristic inspecting device may further include an installation condition determining section configured to determine a size of a gap between a magnetic pole provided in the stator and a magnetic pole provided in the mover based on the computed result from the constant computing section to determine whether or not the three-phase motor is properly installed based on the determined gap size. Because the gap size and the counter electromotive force constant are proportional to each other, it is possible to know the gap size in the linear motor installed in the apparatus by utilizing such proportional relationship, thereby determining the installation condition of the motor.

In general, the stator and the mover of a linear motor are separately formed, and assembled together at the location of use. That is, motor installation and gap adjustment are often performed by a user. Therefore, gap adjustment may not be adequately performed using a gap gauge, as a result of which a sufficient output of the linear motor may not be obtained. By using the motor characteristic inspecting device according to the present invention, gap adjustment can be easily performed.

Preferably, the installation condition determining section for a linear motor is configured to determine that the gap size exceeds an appropriate range if the counter electromotive force constant falls below a predetermined threshold range and that the gap size falls below the appropriate range if the counter electromotive force constant exceeds the predetermined threshold range, and to determine that the three-phase motor is not properly installed in either case. This configuration further facilitates gap adjustment.

The present invention also provides a motor condition inspection method including: preparing the motor characteristic inspecting device according to the present invention; electrically connecting the armature windings and the motor characteristic inspecting device with power supply lines disconnected from the three-phase motor installed in the apparatus; applying an external force to the mover of the three-phase motor to generate the counter electromotive forces in the armature windings; and determining a condition of the three-phase motor based on the computed result displayed on the result display section of the motor characteristic inspecting device. The result display section displays the computed result (a numerical value) for the counter electromotive force constant, which allows a measurer to determine whether or not the obtained counter electromotive force constant is proper for the motor. If the obtained counter electromotive force constant is not proper, it is found that the motor is in an abnormal state. The result display section may display a predetermined indication for an expected computed result of the counter electromotive force constant. This configuration facilitates determining whether or not the characteristics of the motor are proper even if the counter electromotive force constant of the motor is not readily available.

BRIEF DESCRIPTION OF THE DRAWINGS

FIG. 2A shows the waveforms of counter electromotive forces output when an external force is applied to a motor to drive the motor in the embodiment; FIGS. 2B to 2D show the waveforms of signals output from zero crossing detecting sections for U-phase, V-phase, and W-phase, respectively; and FIG. 2E shows the waveform of a signal output from an angular range detecting section.

DESCRIPTION OF THE PREFERRED EMBODIMENTS

Figure 1:
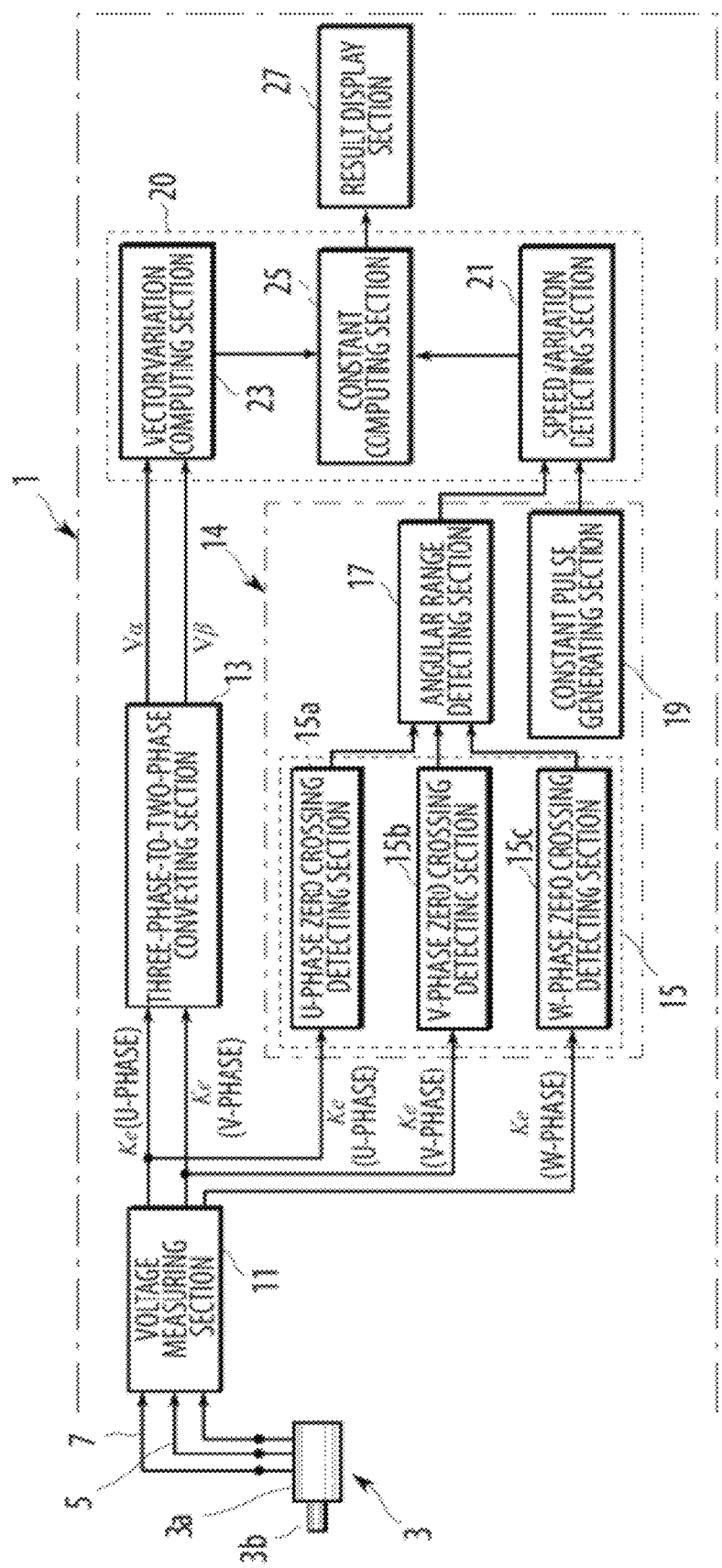
FIG. 1 is a block diagram showing the configuration of a motor characteristic inspecting device according to a first embodiment of the present invention.

Embodiments of the present invention will be described in detail below with reference to the drawings. FIG. 1 is a block diagram showing a motor characteristic inspecting device according to first embodiment of the present invention.

In the first embodiment shown in FIG. 1, a motor characteristic inspecting device 1 is connected to a three-phase rotary motor 3 to be inspected. The three-phase rotary motor 3 includes a stator 3a fixed to an apparatus and a mover 3b formed by a rotor that is rotatable, and has three phases, namely U-phase, V-phase, and W-phase. The motor to be inspected is disconnected from the power supply lines, and the motor characteristic inspecting device 1 is connected via a cable 7 to power supply lines 5 which are connected to the armature windings of the stator 3a.

The motor characteristic inspecting device 1 is basically formed by a voltage measuring section 11, a three-phase-to-two-phase converting section 13, an electrical angle acquiring section 14, a computing section 20, and a result display section 27.

[Voltage Measuring Section]

The voltage measuring section 11 receives counter electromotive forces for three phases generated when the three-phase rotary motor 3 is moved by an external force, and measures and stores the voltage values ($K_{eu}$, $K_{ev}$, and $K_{ew}$) for U-phase, V-phase, and W-phase.

[Three-Phase-to-Two-Phase Converting Section]

The three-phase-to-two-phase converting section 13 reads from the voltage measuring section 11 the U-phase voltage value $K_{eu}$ and the V-phase voltage value $K_{ev}$ at times $t_1$ and $t_2$, and performs a three-phase-to-two-phase conversion on the read voltage values. In the three-phase-to-two-phase conversion, the counter electromotive forces for three phases are converted into a two-phase AC voltage equivalent to the counter electromotive forces for three phases through αβ conversion such that α axis indicates the counter electromotive force for U-phase. The term "voltage vector ($V_{vec}$)" used herein stands for the vector of the voltage obtained through the three-phase-to-two-phase conversion, and $V_α$ and $V_β$ stand for α component and β component, respectively, of the voltage vector. The three-phase-to-two-phase converting section 13 outputs α component $V_α$ and β component $V_β$ of the voltage vector to a vector variation computing section 23. In the embodiment, the three-phase-to-two-phase conversion can be performed using only the U-phase voltage value $K_{eu}$ and the V-phase voltage value $K_{ev}$, among the voltage values for three phases, as discussed later, and therefore the W-phase voltage value $K_{ew}$ is not read.

[Electrical Angle Acquiring Section]

The electrical angle acquiring section 14 is formed by a zero crossing detecting section 15, an angular range detecting section 17, and a constant pulse generating section 19.

The zero crossing detecting section 15 includes a U-phase zero crossing detecting section 15a, a V-phase zero crossing detecting section 15b, and a W-phase zero crossing detecting section 15c, and is configured to output a voltage whose value changes from 0 V to 5 V (that is, switches to a signal "1") and from 5 V to 0 V (that is, switches to a signal "0") at points (zero crossing points) where the waveform of the counter electromotive force for each phase crosses the value of zero. For example, if the counter electromotive forces for three phases having the waveforms of FIG. 2A are generated when the three-phase rotary motor 3 is moved by an external force, the zero crossing detecting section 15 reads the voltage values ($K_{eu}$, $K_{ev}$, and $K_{ew}$) for U-phase, V-phase, and W-phase from the voltage measuring section 11 to output signals respectively having waveforms of FIGS. 2B to 2D. After receiving the signals from the zero crossing detecting section 15, the angular range detecting section 17 computes the logical sum of the three signals output from the zero crossing detecting section 15 to output a signal defining an angular range in terms of electrical angle. In the embodiment, the angular range detecting section 17 is configured to output the signal only during a period when the U-phase zero crossing detecting section 15a outputs a signal "1" (see FIG. 2B), the V-phase zero crossing detecting section 15b outputs a signal "0" (see FIG. 2C), and the W-phase zero crossing detecting section 15c outputs a signal "0" (see FIG. 2D). This allows the angular range detecting section 17 to output a pulse signal (angular range signal) indicating an angular range of 60°, such as that shown in FIG. 2E. The time t at the start point of the angular range signal is defined as $t_1$, and the time t at the end point of the angular range signal is defined as $t_2$.

[Computing Section]

The computing section 20 is formed by a speed variation detecting section 21, a vector variation computing section 23, and a constant computing section 25.

The speed variation detecting section 21 calculates a time Δt taken by the mover 3b to move over an angular range of 60° in terms of electrical angle, based on the angular range signal output from the angular range detecting section 17 and constant pulses output from the constant pulse generating section 19. The constant pulse generating section 19 outputs pulses with a known frequency (or pulse width). The speed variation detecting section 21 can calculate the time Δt taken by the mover 3b to move over an angular range of 60° in terms of electrical angle, by counting the number of pulses, among the pulses output from the constant pulse generating section 19, that are input between the start point and the end point of the angular range signal output from the angular range detecting section 17. The symbol Δt represents $Δt = t_2 - t_1$. The speed variation detecting section 21 further computes the frequency of the Δt time segment and variations in number of revolutions during the Δt time segment.

The vector variation computing section 23 computes a voltage vector variation amount $\Delta V_{vec}$ during Δt, that is, for an angular range of 60° in terms of electrical angle.

The constant computing section 25 computes a counter electromotive force constant $K_{e\phi}$ based on the computed results from the speed variation detecting section 21 and the vector variation computing section 23, and displays the computed counter electromotive force constant $K_{e\phi}$ on the result display section 27.

[Voltage Vector]

The physical meaning of the voltage vector $V_{vec}$ and the voltage vector variation amount $\Delta V_{vec}$ will be described with reference to FIGS. 3 and 4.

Figure 3A:
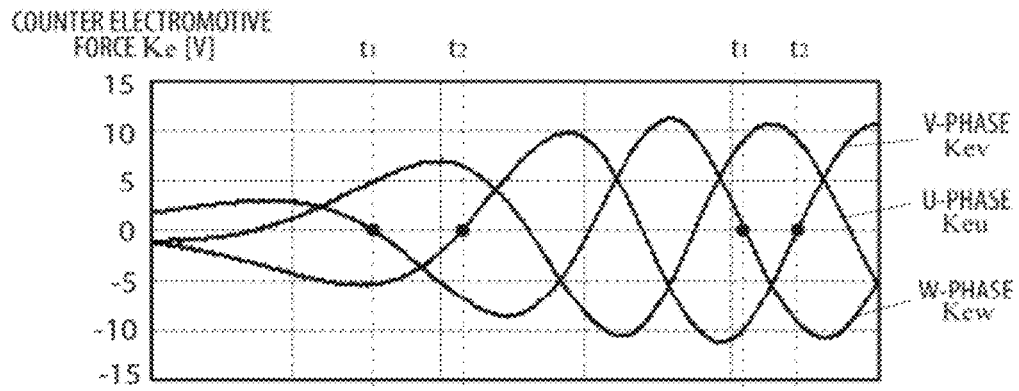
FIG. 3A shows the waveforms of counter electromotive forces output when an external force is applied to a motor to drive the motor in the embodiment.
Figure 3B:
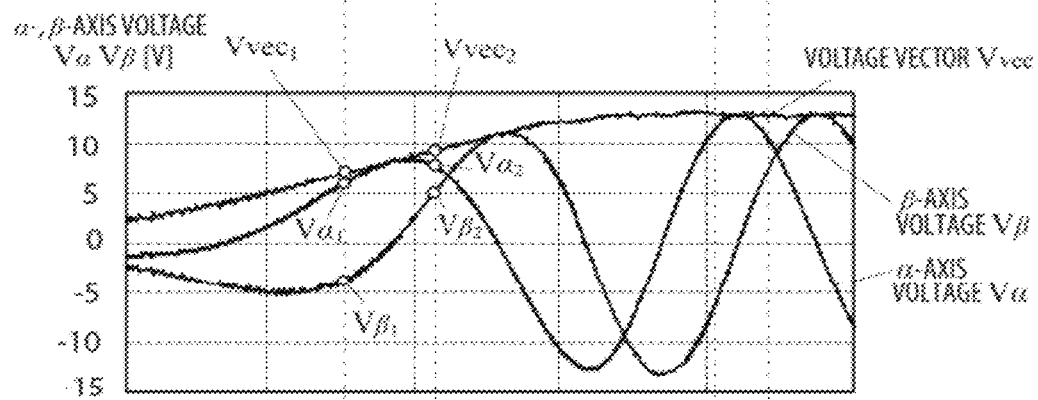
FIG. 3B shows the waveforms of a two-phase AC voltage (Vα,Vβ) obtained by performing a three-phase-to-two-phase conversion on the counter electromotive forces for three phases of FIG. 3A.
Figure 3C:
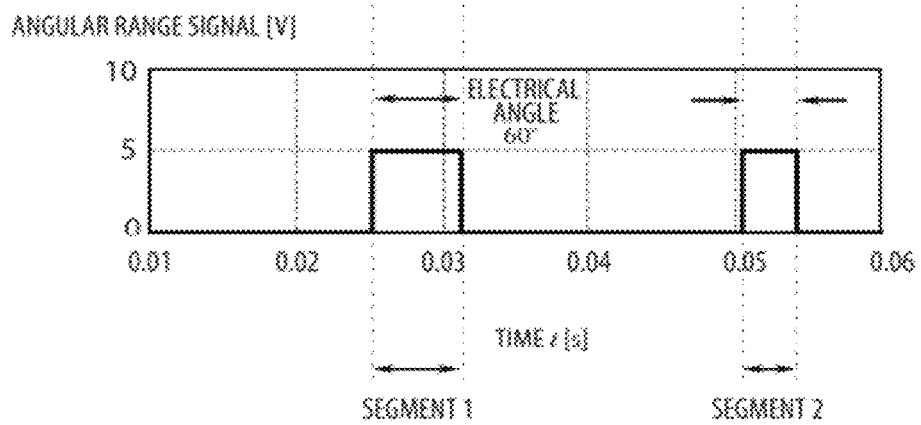
FIG. 3C shows the waveform of a signal output from the angular range detecting section in response to the waveforms of FIG. 3A.

FIG. 3A shows the waveforms of the counter electromotive forces for three phases. FIG. 3B shows the waveforms of the two-phase AC voltage ($V_\alpha$, $V_\beta$) obtained by performing a three-phase-to-two-phase conversion on the counter electromotive forces for three phases of FIG. 3A. FIG. 3C shows an angular range signal corresponding to the waveforms of FIG. 3A, including pulses having a width corresponding to an electrical angle of 60°. The voltage vector $V_{vec}$ is represented as a vector having α component $V_\alpha$ and β component $V_\beta$. The time response of the voltage vector $V_{vec}$ is represented by the waveform depicted in FIG. 3B. That is, an asymptote of $V_\alpha$ and $V_\beta$ indicates the locus of the voltage vector $V_{vec}$. Then, taking the time segment 1 indicated in the drawing as an example, the amount of variation in voltage vector from $V_{vec1}$ to $V_{vec2}$ corresponds to $\Delta V_{vec}$.

Figure 4:
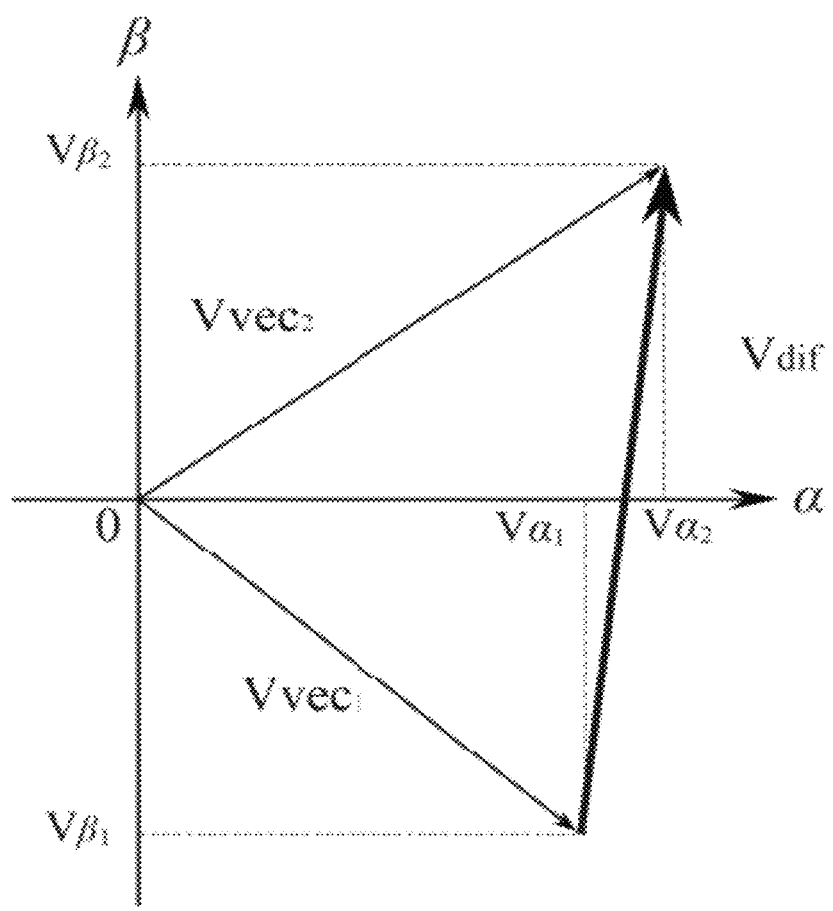
FIG. 4 is a conceptual illustration showing voltage vectors used in the present invention.

FIG. 4 shows a voltage vector for the time segment 1 on the αβ coordinate plane. As shown, the angle between $V_{vec1}$ and $V_{vec2}$ corresponds to an electrical angle of 60°, and the difference between $V_{vec1}$ and $V_{vec2}$ corresponds to a vector $V_{dif}$. In the present invention, the magnitude of the vector $V_{dif}$ is utilized as the "voltage vector variation amount $\Delta V_{vec}$". As the vector $V_{dif}$ becomes more parallel to β axis, the duty ratio of the frequency obtained before a peak value of the counter electromotive force and the duty ratio of the frequency obtained after the peak value of the counter electromotive force become closer to each other, which results in a smaller detection error. For example, if a voltage vector for the time segment 2 of FIG. 3 is depicted, the vector $V_{dif}$ is substantially parallel to β axis. Therefore, the error can be further reduced compared to when the time segment 1 is utilized.

[Flow from Measurement to Display]

Figure 5:
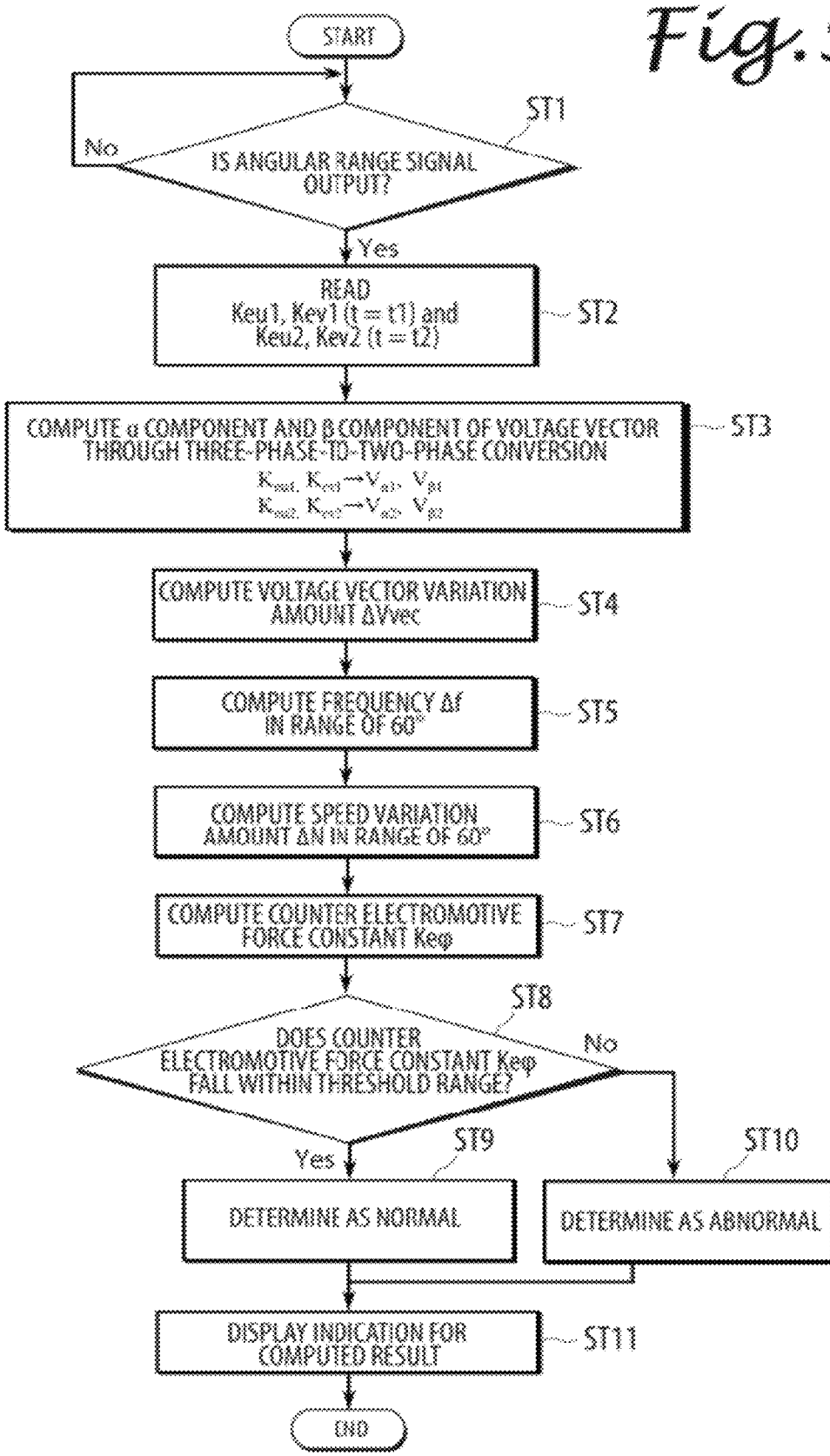
FIG. 5 is a flowchart showing an algorithm of software used to display a counter electromotive force constant and an indication for a computed result according to the first embodiment of the present invention.

Next, the flow from the measurement to the display will be discussed in detail with reference to the flowchart of FIG. 5.

When the mover 3b of the three-phase rotary motor 3 is moved by an external force, the voltage measuring section 11 receives the waveforms of counter electromotive forces for three phases generated by the motor 3, and measures and stores the voltage values ($K_{eu}$, $K_{ev}$, and $K_{ew}$) for U-phase, V-phase, and W-phase to send a signal to the zero crossing detecting section 15. When an angular range signal is output from the angular range detecting section 17 in the method discussed above (step ST1), the three-phase-to-two-phase converting section 13 reads from the voltage measuring section 11 a U-phase voltage value $K_{eu1}$ and a V-phase voltage value $K_{ev1}$ at time $t_1$, which is the start point of the angular range signal, and a U-phase voltage value $K_{eu2}$ and a V-phase voltage value $K_{ev2}$ at time $t_2$, which is the end point of the angular range signal (step ST2). The three-phase-to-two-phase converting section 13 then computes $V_{\alpha 1}$ and $V_{\beta 1}$ and $V_{\alpha 2}$ and $V_{\beta 2}$ through a three-phase-to-two-phase conversion using the formula (1) to send the computed values to the vector variation computing section 23 (step ST3).

$$V_\alpha = \sqrt{\frac{3}{2}} K_{eu} \quad \text{[Expression 2]}$$

$$V_\beta = \frac{1}{\sqrt{2}} K_{eu} + \sqrt{2} K_{ev}$$

In the embodiment, the three-phase-to-two-phase conversion can be performed using only the U-phase voltage value $K_{eu}$ and the V-phase voltage value $K_{ev}$, among the voltage values for three phases, as is clear from the formula (1), and therefore the W-phase voltage value $K_{ew}$ is not read.

The vector variation computing section 23 computes the voltage vector variation amount $\Delta V_{vec}$ based on the received $V_{\alpha 1}$ and $V_{\beta 1}$ and $V_{\alpha 1}$ and $V_{\beta 2}$ values using the formula (2) (step ST4).

$$\Delta V_{vec} = \sqrt{(V_{\alpha 2} - V_{\alpha 1})^2 + (V_{\beta 2} - V_{\beta 1})^2} \quad \text{[Expression 3]}$$

The speed variation detecting section 21 computes a frequency Δf [Hz] for an angular range of 60° (Δt) based on the calculated time Δt and electrical angle of 60° (Δθ=1.047 [rad]) using the formula (3) (step ST5). The speed variation detecting section 21 also computes a speed variation amount (number of revolutions) ΔN [rpm] in an angular range of 60° (Δt) based on the frequency Δf using the formula (4) (step ST6).

$$\Delta f = \frac{\Delta \theta}{2 \times \pi \times \Delta t} \quad \text{[Expression 4]}$$

$$\Delta N = \frac{120 \times \Delta f}{P_o}$$

where $P_o$ stands for the number of poles of the rotor.

The constant computing section 25 computes a counter electromotive force constant $K_{e\phi}$ [Vrms/rpm] using the formula (5) (step ST7).

$$K_e \phi = \frac{\left(\frac{\Delta V_{vec}}{\sqrt{3/2}}\right)}{\Delta N} \times \frac{1}{\sqrt{2}} \quad \text{[Expression 5]}$$

The constant computing section 25 compares the computed counter electromotive force constant $K_{e\phi}$ and a predetermined threshold to determine whether or not the counter electromotive force constant $K_{e\phi}$ falls within a predetermined threshold range (step ST8). If the counter electromotive force constant $K_{e\phi}$ falls within the threshold range, it is determined that the motor is normal (step ST9). If the counter electromotive force constant $K_{e\phi}$ does not fall within the threshold range, it is determined that the motor is abnormal (step ST10). The result display section 27 displays an indication for the computed result (step ST11). In the embodiment, the threshold is set within ±10% of the theoretical value of $K_{e\phi}$.

According to the embodiment, the error in the computed counter electromotive force constant can be reduced even when abrupt variations in number of revolutions occur. In order to further reduce the error, however, the result display section may be configured to display the computed result or the indication for the computed result if a difference between two voltage vector variation amounts for two divided angular ranges obtained by bisecting the predetermined angular range is equal to or smaller than a predetermined allowable value. If the difference between two voltage vector variation amounts ΔV$_{vec}$ is larger than the predetermined allowable value, abrupt variations in number of revolutions are occurring, which tends to cause a significant error in the computed counter electromotive force constant. Thus, the reliability of the inspection results can be improved by causing the result display section 27 to display the computed result or the indication for the computed result only when the difference is equal to or smaller than the allowable value.

In the present invention, moreover, a plurality of counter electromotive force constants K$_{e\phi}$ may be computed based on a plurality of angular range signals, rather than a single angular range signal, and a determination may be made based on the average of the plurality of counter electromotive force constants. This further reduces the error.

Furthermore, the zero crossing detecting section 15 may be configured to additionally detect zero crossing points for V$_\alpha$ and V$_\beta$, which allows detection of an angular range of 30° through a combination of zero crossing waveforms for U-phase, V-phase, W-phase, V$_\alpha$, and V$_\beta$. The error can be further reduced for an angular range of 30° compared to an angular range of 60°.

The present invention is directed to three-phase motors, whose W-phase voltage value can be obtained through calculation using measured voltage values for the other two phases, namely U-phase and V-phase. Therefore, it is a matter of course that the voltage measuring section 11 may measure only the voltage values for U-phase and V-phase and obtain the voltage value for W-phase through calculation.

[Inspection of Linear Motor]

Figure 6:
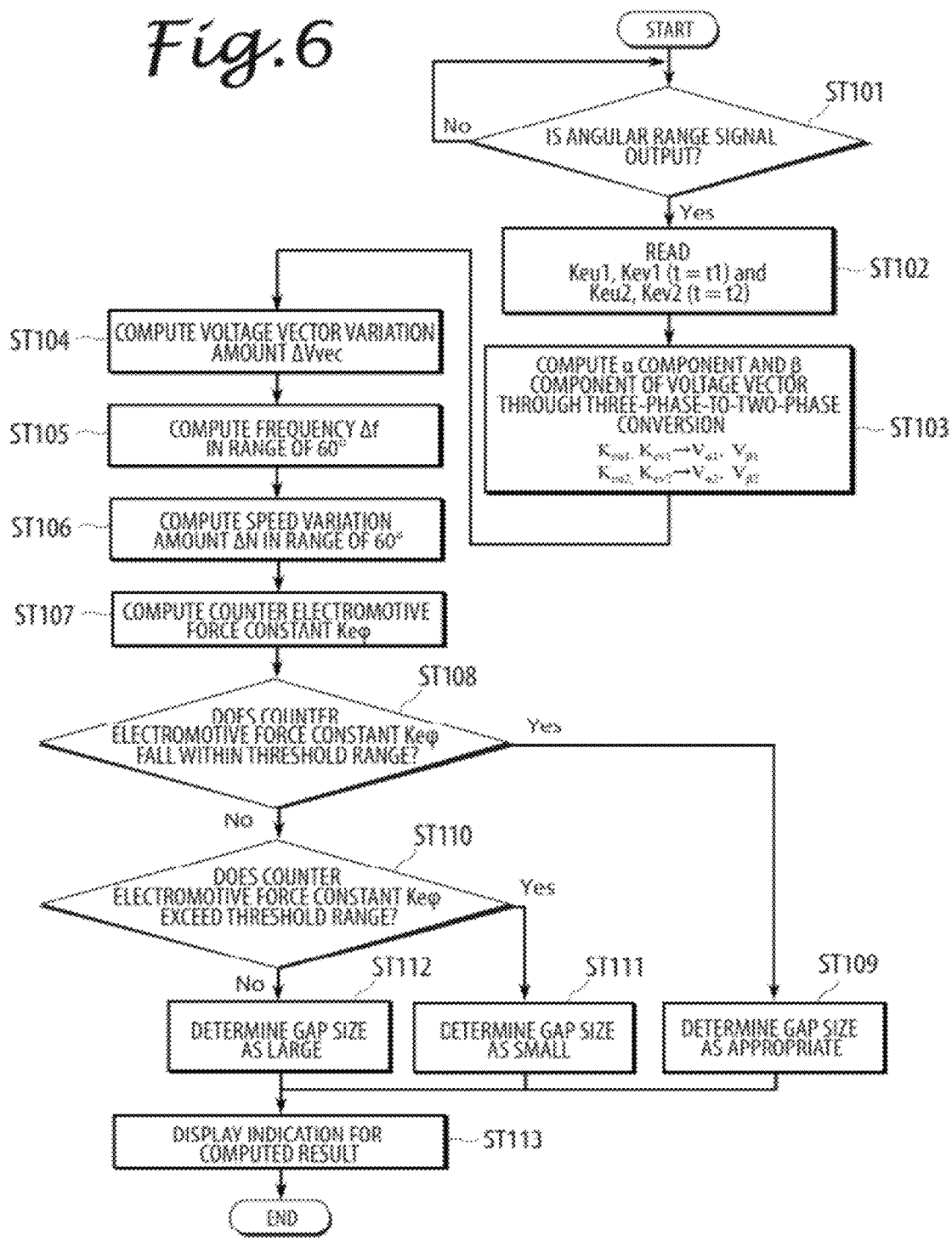
FIG. 6 is a flowchart showing an algorithm of software used to display a counter electromotive force constant and an indication for a computed result according to a second embodiment of the present invention.
Figure 7:
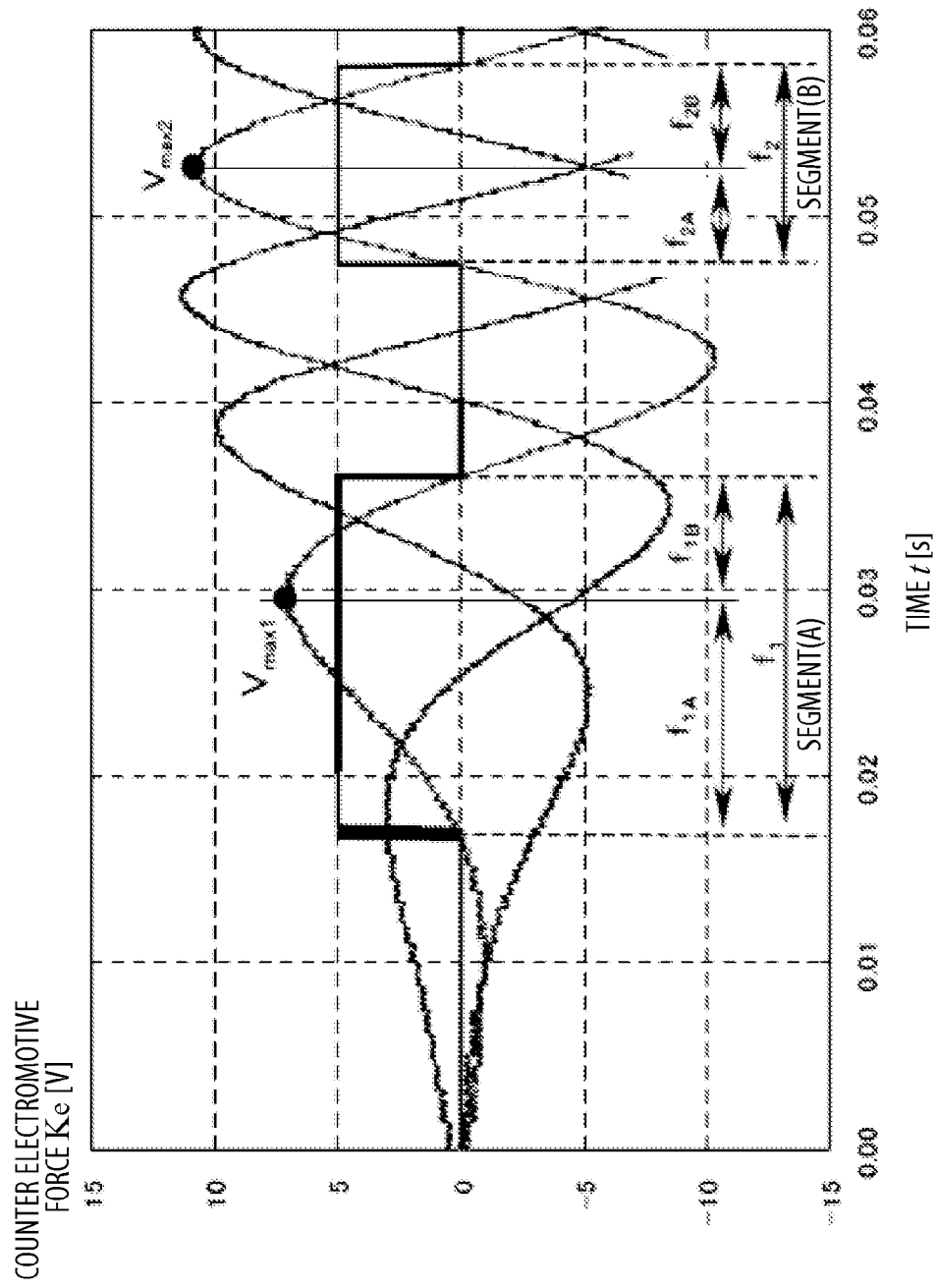
FIG. 7 is a conceptual illustration showing computation of a counter electromotive force constant according to the related art.

FIG. 6 is a flowchart showing a second embodiment where the motor condition inspection method according to the present invention is applied to a linear motor that generates counter electromotive forces for three phases. In FIG. 6, steps that are common to those according to the first embodiment are denoted by reference numerals obtained by adding 100 to the reference numerals shown in FIG. 5. If a linear motor is to be inspected, in step ST106, a speed variation amount ΔV [m/s] for an angular range of 60° (Δt) in terms of electrical angle is computed based on the frequency Δf using the formula (6).

$$\Delta V = \tau_p \times \Delta f \quad \text{[Expression 6]}$$

where τp stands for the pole pitch [m] of the linear motor.

In step ST107, a counter electromotive force constant K$_{e\phi}$ [Vrms/m/s] is computed using the formula (7).

$$K_e\phi = \frac{\left(\frac{\Delta V_{vec}}{\sqrt{3/2}}\right)}{\Delta V} \times \frac{1}{\sqrt{2}} \quad \text{[Expression 7]}$$

Then, it is determined whether or not the counter electromotive force constant K$_{e\phi}$ falls within a certain threshold range (step ST108). If the counter electromotive force constant K$_{e\phi}$ falls within the threshold range, it is determined that the gap size is appropriate (step ST109). If the counter electromotive force constant K$_{e\phi}$ does not fall within the threshold range, it is determined whether or not the counter electromotive force constant K$_{e\phi}$ exceeds the threshold range (step ST110). If the counter electromotive force constant K$_{e\phi}$ exceeds the threshold range, it is determined that the gap size is small (step ST111). If the counter electromotive force constant K$_{e\phi}$ falls below the threshold range, it is determined that the gap size is large (step ST112). Finally, the result display section 27 displays an indication for the computed result including the counter electromotive force constant (step ST113).

According to the present invention, the characteristics of a motor can be accurately inspected based on the waveforms of counter electromotive forces for three phases. Thus, the characteristics of the motor can be inspected without removing the motor from an apparatus and without the need for a tachometer or a speed sensor.

While certain features of the invention have been described with reference to example embodiments, the description is not intended to be construed in a limiting sense. Various modifications of the example embodiments, as well as other embodiments of the invention, which are apparent to persons skilled in the art to which the invention pertains, are deemed to lie within the spirit and scope of the invention.

What is claimed is:

1. A motor condition inspection method of inspecting a condition of a three-phase motor installed in an apparatus without removing the three-phase motor from the apparatus, the method comprising:

preparing a motor characteristic inspecting device that comprises:
  an angular range detecting section configured to detect a predetermined angular range including a peak value of a counter electromotive force for one phase among counter electromotive forces for three phases generated in armature windings of the three-phase motor when a mover of the three-phase motor is moved with no power supply, the predetermined angular range being less than 180° in terms of electrical angle;
  a three-phase-to-two-phase converting section configured to convert the counter electromotive forces for three phases into a two-phase AC voltage equivalent to the counter electromotive forces for three phases through αβ conversion such that α axis indicates the counter electromotive force for one phase;
  a vector variation computing section configured to compute a voltage vector variation amount which is an amount of variation in voltage vector in the predetermined angular range, based on an amount of variation in α component and an amount of variation in β component in the predetermined angular range;
  a speed variation detecting section configured to detect a speed variation amount which is an amount of variation in speed of the mover in the predetermined angular range;
  a constant computing section configured to compute a counter electromotive force constant based on the speed variation amount and the voltage vector variation amount; and
  a result display section configured to display a predetermined indication for a computed result or an expected computed result of the counter electromotive force constant;

electrically connecting the armature windings and the motor characteristic inspecting device with power supply lines disconnected from the three-phase motor installed in the apparatus;

applying an external force to the mover of the three-phase motor to generate the counter electromotive forces in the armature windings; and determining a condition of the three-phase motor based on the computed result displayed on the result display section of the motor characteristic inspecting device.

2. The motor condition inspection method according to claim 1, wherein the angular range detecting section is configured to detect zero crossing points at which the counter electromotive forces for three phases become zero, and to determine an angular range of 60° as the predetermined angular range based on the zero crossing points.

3. The motor condition inspection method according to claim 2, wherein:
the three-phase motor is a three-phase rotary motor in which the mover is rotatable; and
the speed variation detecting section is configured to detect the number of revolutions per unit time made by the mover as the speed, and to identify an amount of variation in the number of revolutions as the speed variation amount.

4. The motor condition inspection method according to claim 1, wherein
the angular range detecting section is configured to detect zero crossing points at which the counter electromotive forces for three phases and the two-phase AC voltage become zero, and to determine an angular range of 30° as the predetermined angular range based on the zero crossing points.

5. The motor condition inspection method according to claim 4, wherein:
the three-phase motor is a three-phase rotary motor in which the mover is rotatable; and
the speed variation detecting section is configured to detect the number of revolutions per unit time made by the mover as the speed, and to identify an amount of variation in the number of revolutions as the speed variation amount.

6. The motor condition inspection method according to claim 1, wherein the vector variation computing section computes the voltage vector variation amount by the following formula:

$$\Delta V_{vec} = \sqrt{(V_{\alpha 2} - V_{\alpha 1})^2 + (V_{\beta 2} - V_{\beta 1})^2} \quad \text{[Expression 1]}$$

where $V_{\alpha 1}$ and $V_{\beta 1}$ stand for $\alpha$ component and $\beta$ component of a first voltage vector at a start point of the predetermined angular range, respectively, and $V_{\alpha 2}$ and $V_{\beta 2}$ stand for $\alpha$ component and $\beta$ component of a second voltage vector at an end point of the predetermined angular range, respectively.

7. The motor condition inspection method according to claim 6, wherein:
the three-phase motor is a three-phase rotary motor in which the mover is rotatable; and
the speed variation detecting section is configured to detect the number of revolutions per unit time made by the mover as the speed, and to identify an amount of variation in the number of revolutions as the speed variation amount.

8. The motor condition inspection method according to claim 1, wherein
the result display section displays the computed result or the indication for the computed result if a difference between two voltage vector variation amounts for two divided angular ranges obtained by bisecting the predetermined angular range is equal to or smaller than a predetermined allowable value.

9. The motor condition inspection method according to claim 8, wherein:
the three-phase motor is a three-phase rotary motor in which the mover is rotatable; and
the speed variation detecting section is configured to detect the number of revolutions per unit time made by the mover as the speed, and to identify an amount of variation in the number of revolutions as the speed variation amount.

10. The motor condition inspection method according to claim 1, wherein:
the three-phase motor is a three-phase rotary motor in which the mover is rotatable; and
the speed variation detecting section is configured to detect the number of revolutions per unit time made by the mover as the speed, and to identify an amount of variation in the number of revolutions as the speed variation amount.

11. The motor condition inspection method according to claim 1, wherein:
the three-phase motor is a linear motor comprising a stator fixed to a stationary portion of the apparatus and the mover provided in a movable portion of the apparatus; and
the motor characteristic inspecting device further comprises an installation condition determining section configured to determine a size of a gap between a magnetic pole provided in the stator and a magnetic pole provided in the mover based on the computed result from the constant computing section to determine whether or not the three-phase motor is properly installed based on the determined gap size.

12. The motor condition inspection method according to claim 11, wherein
the installation condition determining section is configured to determine that the gap size exceeds an appropriate range if the counter electromotive force constant falls below a predetermined threshold range and that the gap size falls below the appropriate range if the counter electromotive force constant exceeds the predetermined threshold range, and to determine that the three-phase motor is not properly installed in either case.

13. A motor characteristic inspecting device capable of inspecting a condition of a three-phase motor installed in an apparatus without removing the three-phase motor from the apparatus, the device comprising:
an angular range detecting section configured to detect a predetermined angular range including a peak value of a counter electromotive force for one phase among counter electromotive forces for three phases generated in armature windings of the three-phase motor when a mover of the three-phase motor is moved with no power supply, the predetermined angular range being less than 180° in terms of electrical angle;
a three-phase-to-two-phase converting section configured to convert the counter electromotive forces for three phases into a two-phase AC voltage equivalent to the counter electromotive forces for three phases through $\alpha\beta$ conversion such that $\alpha$ axis indicates the counter electromotive force for one phase;
a vector variation computing section configured to compute a voltage vector variation amount which is an amount of variation in voltage vector in the predetermined angular range, based on an amount of variation in $\alpha$ component and an amount of variation in $\beta$ component in the predetermined angular range;
a speed variation detecting section configured to detect a speed variation amount which is an amount of variation in speed of the mover in the predetermined angular range;

a constant computing section configured to compute a counter electromotive force constant based on the speed variation amount and the voltage vector variation amount; and a result display section configured to display a predetermined indication for a computed result or an expected computed result of the counter electromotive force constant.

14. The motor characteristic inspecting device according to claim 13, wherein
the angular range detecting section is configured to detect zero crossing points at which the counter electromotive forces for three phases become zero, and to determine an angular range of 60° as the predetermined angular range based on the zero crossing points.

15. The motor characteristic inspecting device according to claim 13, wherein
the angular range detecting section is configured to detect zero crossing points at which the counter electromotive forces for three phases and the two-phase AC voltage become zero, and to determine an angular range of 30° as the predetermined angular range based on the zero crossing points.

16. The motor characteristic inspecting device according to claim 13, wherein the vector variation computing section computes the voltage vector variation amount by the following formula:

$$\Delta V_{vec} = \sqrt{(V_{\alpha 2} - V_{\alpha 1})^2 + (V_{\beta 2} - V_{\beta 1})^2}$$ [Expression 2]

where $V_{\alpha 1}$ and $V_{\beta 1}$ stand for $\alpha$ component and $\beta$ component of a first voltage vector at a start point of the predetermined angular range, respectively, and $V_{\alpha 2}$ and $V_{\beta 2}$ stand for $\alpha$ component and $\beta$ component of a second voltage vector at an end point of the predetermined angular range, respectively.

17. The motor condition inspection method according to claim 13, wherein
the result display section displays the computed result or the indication for the computed result if a difference between two voltage vector variation amounts for two divided angular ranges obtained by bisecting the predetermined angular range is equal to or smaller than a predetermined allowable value.

18. The motor characteristic inspecting device according to claim 13, wherein:
the three-phase motor is a three-phase rotary motor in which the mover is rotatable; and the speed variation detecting section is configured to detect the number of revolutions per unit time made by the mover as the speed, and to identify an amount of variation in the number of revolutions as the speed variation amount.

19. The motor characteristic inspecting device according to claim 13, wherein:
the three-phase motor is a linear motor comprising a stator fixed to a stationary portion of the apparatus and the mover provided in a movable portion of the apparatus; and the motor characteristic inspecting device further comprises an installation condition determining section configured to determine a size of a gap between a magnetic pole provided in the stator and a magnetic pole provided in the mover based on the computed result from the constant computing section to determine whether or not the three-phase motor is properly installed based on the determined gap size.

20. The motor characteristic inspecting device according to claim 19, wherein
the installation condition determining section is configured to determine that the gap size exceeds an appropriate range if the counter electromotive force constant falls below a predetermined threshold range and that the gap size falls below the appropriate range if the counter electromotive force constant exceeds the predetermined threshold range, and to determine that the three-phase motor is not properly installed in either case.

* * * * *